United States Patent [19]

Walkup et al.

[11] Patent Number: 4,850,891
[45] Date of Patent: Jul. 25, 1989

[54] MEMORY MODULE SOCKET

[75] Inventors: William B. Walkup, Barrington; Richard J. D'Amico, Cranston, both of R.I.

[73] Assignee: Augat Inc., Attleboro, Mass.

[21] Appl. No.: 176,842

[22] Filed: Apr. 4, 1988

[51] Int. Cl.⁴ ............................................. H01R 13/62
[52] U.S. Cl. .................................... 439/326; 439/327; 439/64
[58] Field of Search ......................... 439/55, 64, 68–73, 439/330, 341, 377, 525, 629, 630, 634–637, 631, 632, 325–327; 361/413–415

[56] References Cited

U.S. PATENT DOCUMENTS

| | | | |
|---|---|---|---|
| 3,246,279 | 4/1966 | Storcel | 439/377 |
| 4,589,794 | 5/1986 | Sugiura et al. | 439/377 |
| 4,737,120 | 4/1988 | Grabbe et al. | 439/636 |

Primary Examiner—David Pirlot
Attorney, Agent, or Firm—Weingarten, Schurgin, Gagnebin & Hayes

[57] ABSTRACT

An electronic memory module socket is provided in which a memory module is easily insertable into and removable from the socket, and once inserted is locked into position for good mechanical retension of the module and proper electrical contact between socket contacts and module contacts. Locking-arms disposed at respective ends of the socket cooperate with openings in the memory module's circuit board to lock the module into the socket body. Detents are provided at respective ends of the socket body to additionally latch the module.

6 Claims, 6 Drawing Sheets

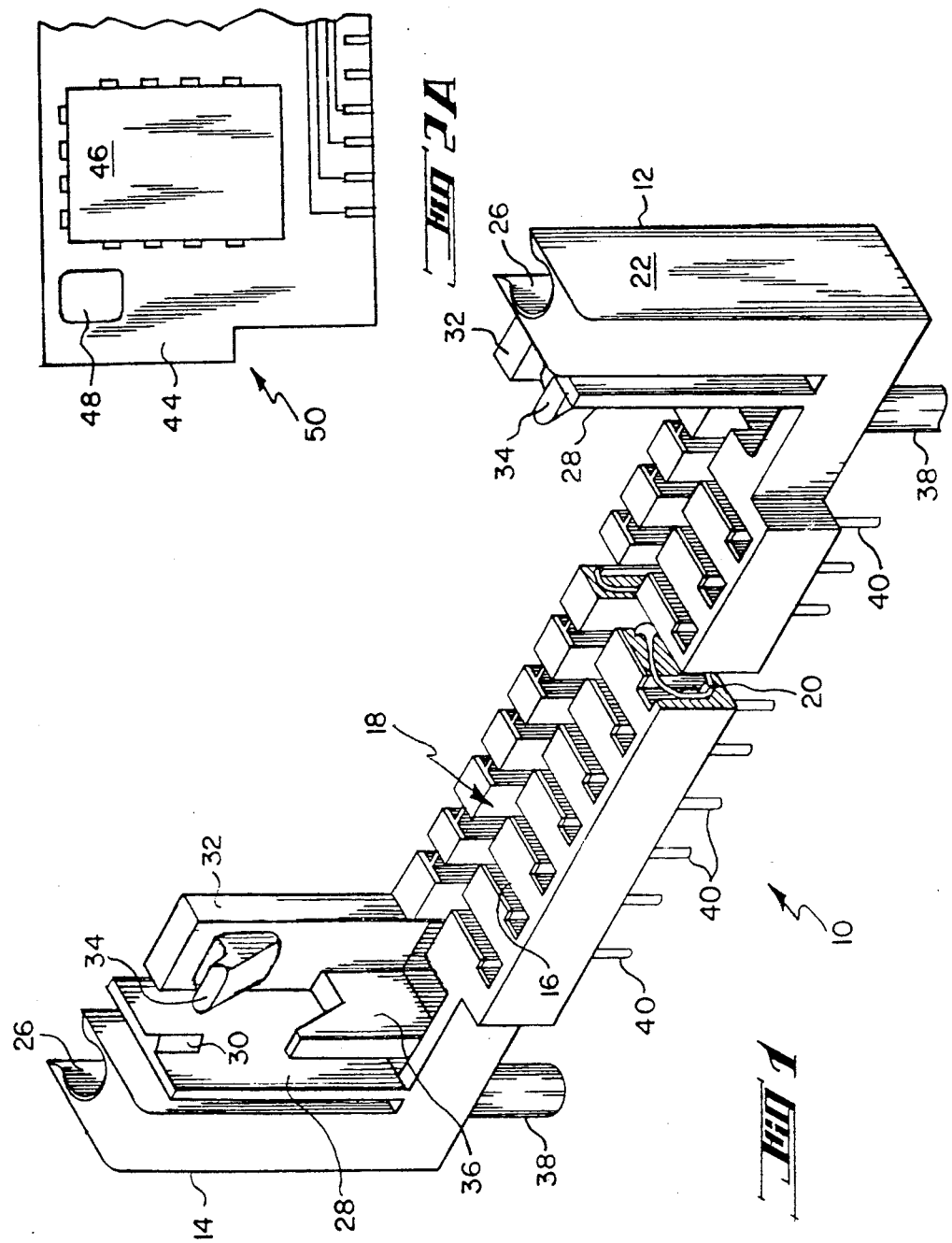

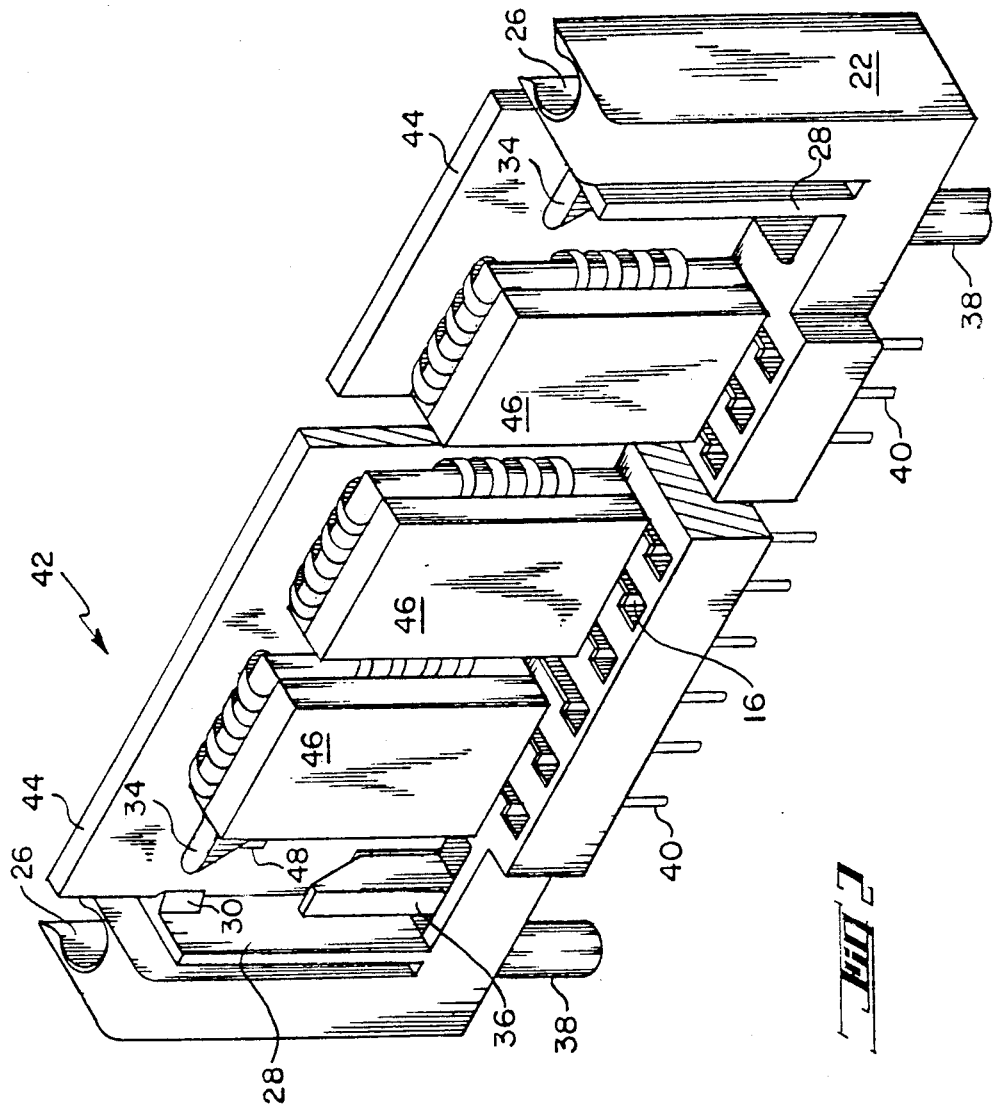

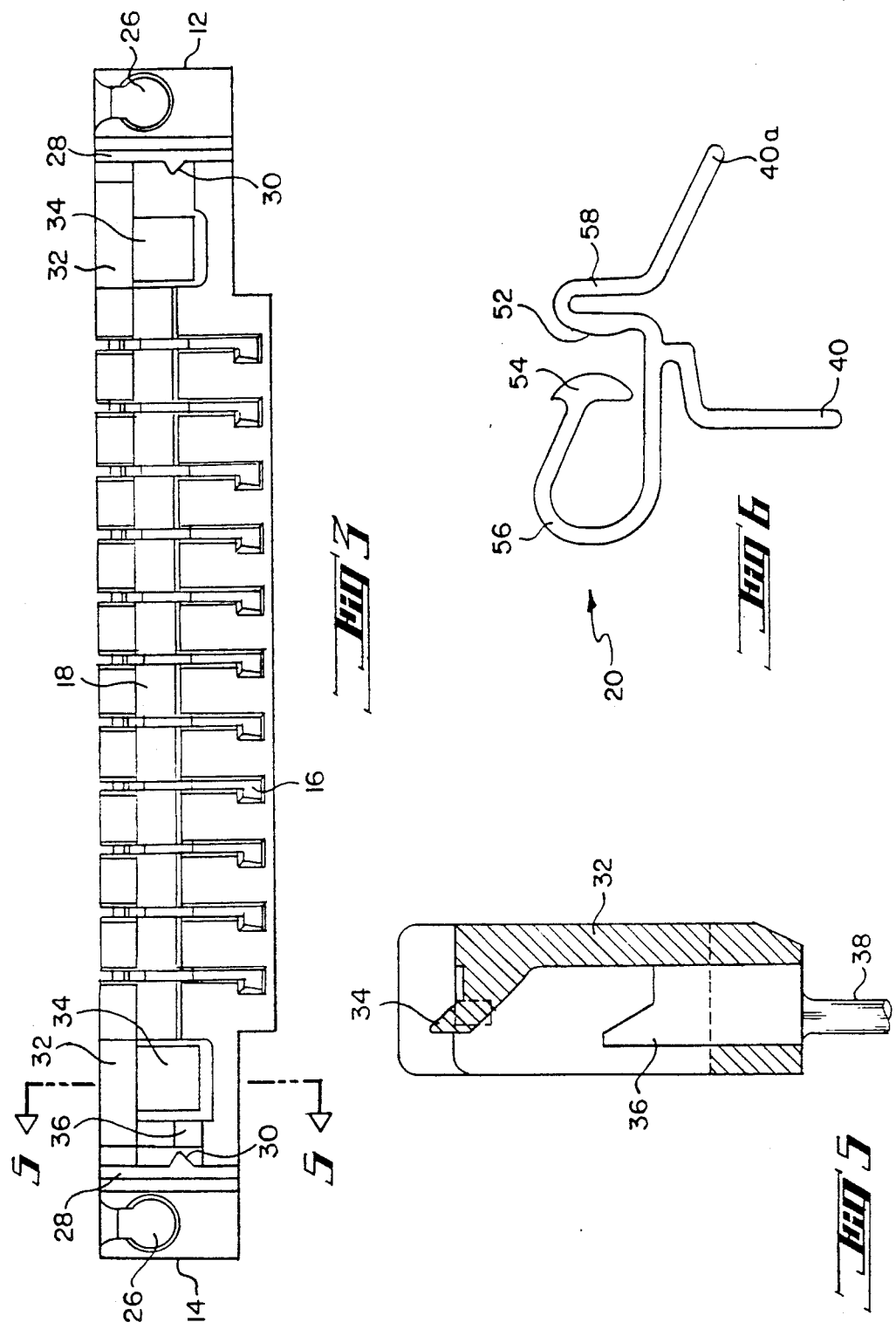

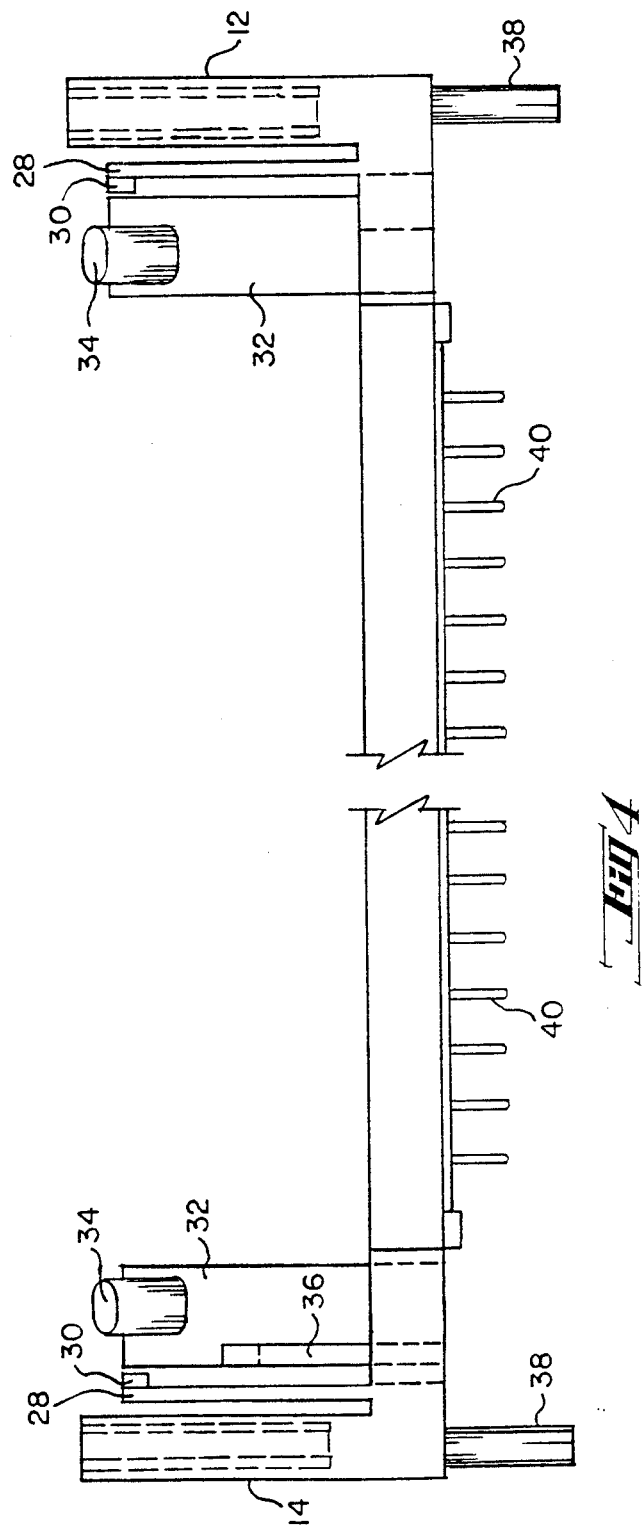

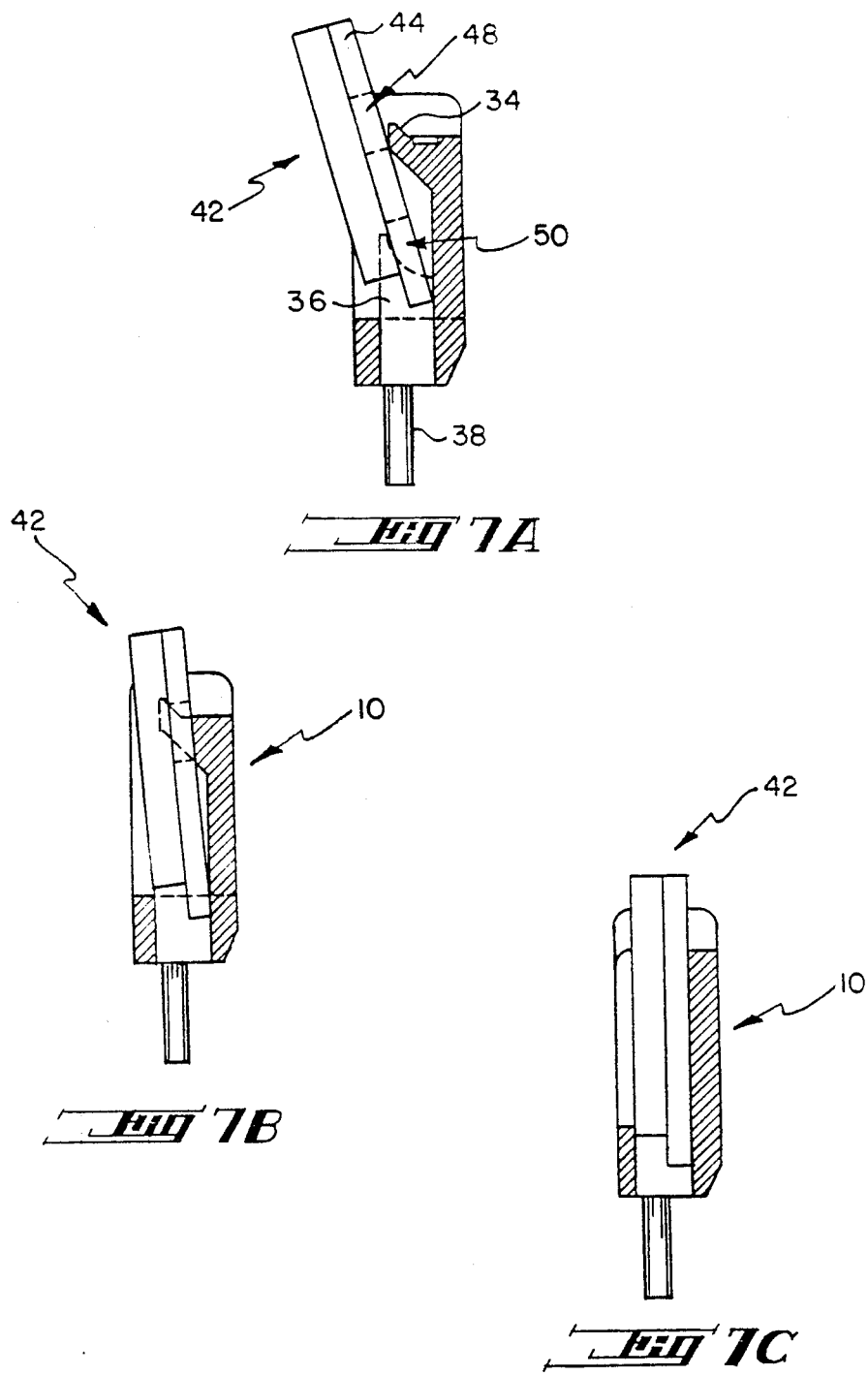

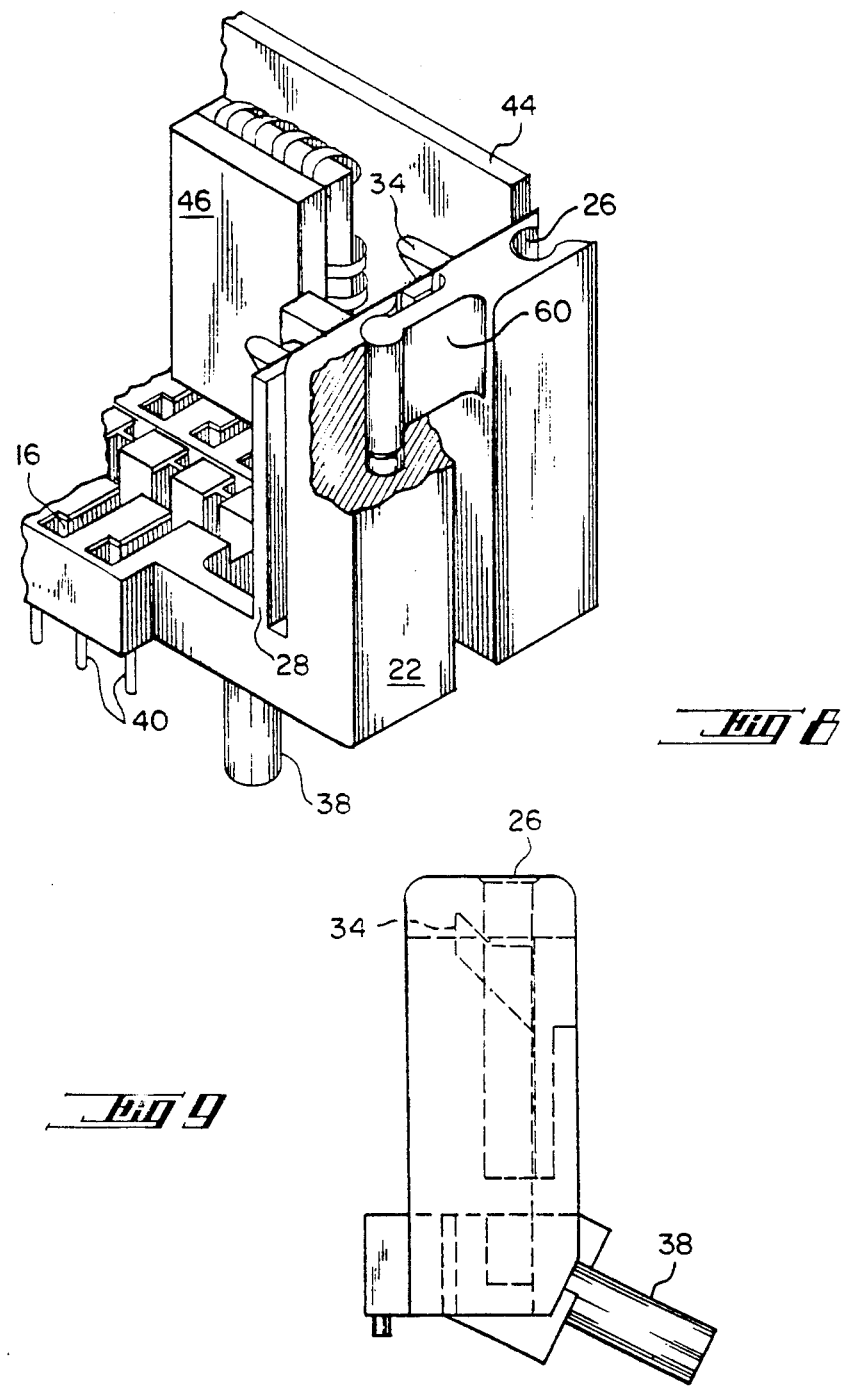

MEMORY MODULE SOCKET

FIELD OF THE INVENTION

This invention relates to electronic component sockets and more particularly to a socket for an electronic memory module.

BACKGROUND OF THE INVENTION

Electronic memories are often embodied in electronic component packages contained on a memory circuit board which in turn is pluggably installed into a mating socket on a large mounting circuit board. It is usually desirable to provide as large a memory capacity as can be achieved on a given mounting circuit board and there is thus the need for the efficient mounting of electronic memory components to provide a high packing density to achieve large memory capacity and yet allow access to the components for removal and replacement. A plurality of memory components is usually mounted on the memory circuit board which is plugged into the associated socket. Such a memory circuit board having memory components is usually referred to as a memory module.

SUMMARY OF THE INVENTION

The present invention provides an electronic memory module socket in which the module is easily insertable and removable from the socket, and once inserted is locked into position for good mechanical retension of the module and proper electrical continuity between the socket contacts and module contacts. In a preferred embodiment the novel socket is of single in-line configuration in which the socket leads are disposed in a linear array and which is insertable into a corresponding array of mounting openings in an associated mounting circuit board. Two or more sockets of like configuration can be mounted in side by side relationship to increase the packing density of the mounted sockets and the memory modules installed therein. The memory module board includes openings which are cooperative with locking-arms disposed at respective ends of the socket to lock the module board to the socket body upon full insertion of the module board into the socket. The module board includes an array of contacts along a lower edge of the board and on opposite surfaces of that edge, these contacts being cooperative with engagement portions of a plurality of electrical contacts retained in the socket body. Detents are provided at respective ends of the socket body to additionally latch the seated module board.

DESCRIPTION OF THE DRAWINGS

The invention will be more fully understood from the following detailed description taken in conjunction with the accompanying drawings in which:

FIG. 1 is a cut-away pictorial view of a socket body in accordance with the invention;

FIG. 2 is a cut-away pictorial view of the socket body of FIG. 1 with the memory module mounted thereon;

FIG. 2A is a plan view of one end of a memory module used in conjunction with the invention.

FIG. 3 is a top view of the socket body of FIG. 1;

FIG. 4 is a front view of the socket body of FIG. 1;

FIG. 5 is a sectional view taken along lines 5—5 of FIG. 3;

FIG. 6 is an elevation view of the socket contact in accordance with the invention;

FIGS. 7A–7C are sectional elevation views illustrating the manner of insertion and removal of the memory module from the socket body;

FIG. 8 is a cut-away pictorial view illustrating the side by side mounting of two sockets in accordance with the invention; and FIG. 9 is an end view of an alternative socket body in accordance with the invention.

DETAILED DESCRIPTION OF THE INVENTION

Referring to the drawings, there is shown a socket body 10 having a first end 12, a second end 14 and an array of recesses 16 disposed between the ends. A longitudinal groove 18 intersects the recesses 16 and extends between the first and second ends 12 and 14 of the socket body. Each of the recesses 16 includes an electrical contact 20 to be further described below. Each first and second end 12 and 14 includes an outer portion 22 and a keyway 26 extending inwardly from the top surface and having a key slot in a sidewall of outer portion 22. A latch 28 is spaced from each end portion 22 and includes a detent finger 30. A column 32 is disposed on one side of the body at each first and second end 12 and 14, and has a locking-arm 34 at an upper end thereof. Second end 14 also has a guide member 36 near the lower end of column 32. The guide member 36 insures that a module can only be inserted in one direction. A mounting post 38 downwardly extends from the bottom surface of the body at each first and second end, 12 and 14 respectively, and contact leads 40 also downwardly extend from the bottom surface of the body. The mounting posts 38 ensure that the socket can be loaded onto its mounting circuit board only one way.

A memory module 42 matable with the socket of the invention is shown in FIG. 2, and includes a memory circuit board 44, often called a daughter board, having a plurality of electronic memory components 46 mounted thereon, the memory circuit board 44 having openings 48 which are respectively cooperative with locking arms 34 for retaining the module in a seated position in the socket. The board 44 includes cut-out portions 50 for accommodation of guide member 36. The installation and removal of the memory module from the socket is illustrated in FIGS. 7A through 7C. The memory module 42 is initially inclined on the slanted portion of the guide member 36, as shown in FIG. 7A, and the module is inserted and rotated over the locking-arms 34, as shown in FIG. 7B, and when in a substantially vertical position is then pushed into seated engagement with the socket contacts, as in FIG. 7C. Removal of the memory module 42 is accomplished by reverse action, namely, the memory module is raised out of engagement with the socket contacts while pivoting the module laterally outward to disengage the memory circuit board 44 from the locking-arms 34 to permit the removal of the module from the socket.

The socket contact is shown in FIG. 6, and includes a fixed contact portion 52 and a movable contact portion 54, which is formed on the end of a generally U-shaped portion 56. A lead 40 downwardly extends from the contact. A second lead 40a angularly extends from an end portion 58 of the contact which joins the fixed contact portion 42. The contact is stamped and formed of a suitable conductive material such as beryllium copper or phosphor bronze. Each contact is retained within a respective recess 16 with the contact portions 52 and 54 confronting the longitudinal groove 18.

In the embodiment of FIG. 1, the leads 40 downwardly extend from the socket body in a position for insertion into cooperative holes of a mounting circuit board, often called a mother board, where typically the leads are soldered to provide permanent electrical connection. The angled lead 40a is employed in an alternative embodiment illustrated in FIG. 9, wherein the socket body is of configuration for angular mounting with respect to a daughter board via the leads 40a. The unused lead 40 or 40a, for a particular embodiment, is removed prior to assembly of the contacts into the associated socket body. The contacts can alternatively be fabricated with just the intended single lead configuration, but it is economical to fabricate the dual leaded contact, as shown in FIG. 6, and to simply remove the unwanted lead section. The contacts disposed along the bottom edge of the memory circuit board 44 are engaged by the contact portions 52 and 54 when the module is seated in the socket.

The posts 38 are cooperative with mounting openings in a mounting circuit board for retention of the socket on the board. These posts guide the socket when it is inserted or withdrawn from the mounting circuit board.

Sockets of like configuration can be mounted in side-by-side contiguous relationship to provide an extremely high packing density of sockets and the memory modules carried thereby on a mounting circuit board. Such a mounting configuration is shown in FIG. 8. The socket body includes female keyways 26, as in FIG. 1, and male keys 60. The keys 60 are cooperative with the keyways 26 to laterally engage the arrayed sockets. The embodiment of FIG. 1 is an end version having only keyways.

Having indicated a preferred embodiment of the present invention, it will occur to those skilled in the art that modifications and alternatives can be practised within the spirit of the invention. Accordingly, the scope of the invention is only defined by the following claims.

What is claimed is:

1. An electronic memory module socket comprising:
   a body of electrically insulative material having a first end, a second end, an array of spaced recesses disposed between the first and second ends, and a longitudinal groove intersecting the array of recesses and extending between the first and second ends;
   a plurality of electrical contacts each disposed in a respective recess and each having a fixed portion confronting one side of the longitudinal groove and a movable portion confronting the opposite side of the longitudinal groove, and a lead outwardly extending from the socket body;
   means integral with each end of the socket body and cooperative with a memory module inserted into the body for locking the module into the body, said means including at each end of the socket body:
   a vertically-upstanding locking-arm column having at an upper end a locking arm having an upwardly-angled portion cooperative with a respective opening in the memory module; and
   a vertically upstanding, thin latching column having a detent finger at an upper end for engaging a respective end of the module; and
   the fixed portion and movable portion of each of said contacts being operative to electrically engage respective contact portions of the memory module when installed in the socket body.

2. The electronic memory module socket of claim 1, wherein said socket further includes a means for interlocking said socket side-by-side with another like socket.

3. The electronic memory module socket of claim 2, wherein said means for interlocking said socket side-by-side with another like socket comprises a plurality of vertically-upstanding posts each integral with an end of the socket body and having at least one of a male key and a female keyway.

4. A electronic memory module socket comprising:
   a body of electrically insulative material having a first end and a second end, an array of spaced recesses disposed between the first and second ends, and a longitudinal groove intersecting the array of recesses and extending between the first and second ends;
   a plurality of electrical contacts each disposed in a respective recess and each having a fixed portion confronting one side of the longitudinal groove and a movable portion confronting the opposite side of the longitudinal groove, and a lead outwardly extending from the socket body;
   a vertically-upstanding locking-arm column integral with one of said first and second ends and having at an upper end a locking arm having an upwardly-angled portion cooperative with a respective opening in a memory module to lock the module into said body;
   a vertically-upstanding, thin latching column disposed on one of said first and second ends and having a detent finger at an upper end for engaging a respective end of said module;
   a guide member post integral with one of said first and second ends, and cooperative with a cutout in said module for orienting said module in said body; and
   the fixed portion and moveable portion of each of said contacts being operative to electrically engage respective contact portions of the memory module when installed in said body.

5. The electronic memory module socket of claim 4, wherein said socket further includes a means for interlocking said socket side-by-side with another like socket.

6. The electronic memory module socket of claim 5, wherein said means for interlocking said socket side-by-side with another like socket comprises a plurality of vertically-upstanding posts each integral with one of said first and second ends and having at least one of a male key and a female keyway.

* * * * *

UNITED STATES PATENT AND TRADEMARK OFFICE
CERTIFICATE OF CORRECTION

PATENT NO. : 4,850,891

DATED : July 25, 1989

INVENTOR(S) : William B. Walkup, et al.

It is certified that error appears in the above-identified patent and that said Letters Patent is hereby corrected as shown below:

Column 2, lines 65-66, "which joins the fixed contact portion 42." should read --which joins the fixed contact portion 52.--

Signed and Sealed this

Twenty-ninth Day of June, 1993

Attest:

MICHAEL K. KIRK

*Attesting Officer*      Acting Commissioner of Patents and Trademarks